(12) United States Patent  (10) Patent No.: US 6,510,405 B1
Gilbertson  (45) Date of Patent: Jan. 21, 2003

(54) METHOD AND APPARATUS FOR SELECTIVELY DISPLAYING SIGNAL VALUES GENERATED BY A LOGIC SIMULATOR

(75) Inventor: Roger Lee Gilbertson, Minneapolis, MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/219,285

(22) Filed: Dec. 22, 1998

(51) Int. Cl.$^7$ ............................................... G06F 17/50
(52) U.S. Cl. .............................. 703/16; 703/17; 714/37; 716/4; 716/7
(58) Field of Search ............................... 703/15, 16, 17, 703/20; 707/202, 204; 714/37, 15, 741; 716/4, 7

(56) References Cited

U.S. PATENT DOCUMENTS

| | | | | |
|---|---|---|---|---|
| 4,725,971 A | * | 2/1988 | Doshi et al. ................. | 364/578 |
| 4,878,179 A | * | 10/1989 | Larsen et al. ................ | 364/490 |
| 5,214,577 A | * | 5/1993 | Sztipanovits et al. ........ | 364/184 |
| 5,305,437 A | * | 4/1994 | Fritze et al. ................. | 395/162 |
| 5,650,946 A | * | 7/1997 | Trimberger .................. | 364/578 |
| 5,794,005 A | * | 8/1998 | Steinman ..................... | 395/500 |
| 5,862,149 A | * | 1/1999 | Carpenter et al. .......... | 371/22.3 |
| 5,905,883 A | * | 5/1999 | Kasuya ........................ | 395/500 |
| 6,012,148 A | * | 1/2000 | Leberge et al. ............... | 714/2 |
| 6,044,211 A | * | 3/2000 | Jain ...................... | 395/500.19 |
| 6,097,885 A | * | 8/2000 | Rayner .................. | 395/500.38 |
| 6,173,241 B1 | * | 1/2001 | Trimberger .................. | 703/13 |
| 6,226,716 B1 | * | 5/2001 | Bauman et al. ............. | 711/145 |
| 6,292,765 B1 | * | 9/2001 | Ho et al. ....................... | 703/14 |

* cited by examiner

*Primary Examiner*—Kevin J. Teska
*Assistant Examiner*—Thai Phan
(74) *Attorney, Agent, or Firm*—Charles A. Johnson; Mark T. Starr; Crompton, Seager & Tufte, LLC

(57) ABSTRACT

A method and apparatus for selectively displaying signal values generated by a logic simulator. Preferably, only those signal values that are relevant to a particular problem or event are displayed. The logic simulator itself may identify and display the selected signals, or a post-processor may read the list or trace window data provided by the simulator and identify and display the appropriate signals. In either case, the present invention may reduce the need to sift through large output listing and/or trace window data to identify the signal values that are relevant to a particular problem or event.

38 Claims, 8 Drawing Sheets

| TIME | A | B | C | D | INC | OVR | BUS |
|------|---|---|---|---|-----|-----|-----|
| 10 | 1 | 1 | 0 | 0 | 1 | 0 | X |
| 20 | 1 | 1 | 0 | 1 | 1 | 0 | X |
| 30 | 1 | 1 | 1 | 0 | 1 | 0 | F |
| 40 | 1 | 1 | 1 | 1 | 1 | 1 | A |
| 50 | 0 | 0 | 0 | 0 | 1 | 0 | C |

76 →

VIRTUAL HISTORY STACK

| TIME | A | B | C | D | BUS |
|------|---|---|---|---|-----|
| 20 | 1 | 1 | 0 | 1 | X |
| 30 | 1 | 1 | 1 | 0 | F |
| 76 → 40 | 1 | 1 | 1 | 1 | A |

METHOD AND APPARATUS FOR SELECTIVELY DISPLAYING SIGNAL VALUES GENERATED BY A LOGIC SIMULATOR

CROSS-REFERENCE TO RELATED APPLICATIONS

This invention is related to U.S. patent application Ser. No. 09/218,812, filed Dec. 22, 1998 entitled "1028.1101101"; U.S. patent application Ser. No. 09/218, 364, filed Dec. 22, 1998 "1028.1102101"; U.S. patent application Ser. No. 09/218,384, filed Dec. 22, 1998, entitled "Method and Apparatus for Efficiently Generating Test Input for a Logic Simulator"; U.S. patent application Ser. No. 08/965,004, filed Nov. 5, 1997, entitled "A Directory-Based Cache Coherency System"; U.S. patent application Ser. No. 08/964,606, filed Nov. 5, 1997, entitled "Message Flow Protocol for Avoiding Deadlocks", U.S. patent application Ser. No. 09/001,588, filed Dec. 31, 1997, entitled "High-speed Memory Storage Unit for a Multiprocessor System Having Integrated Directory and Data Storage Subsystems"; U.S. patent application Ser. No. 09/001,592, filed Dec. 31, 1997, entitled "High-Performance Modular Memory System with Crossbar Connections"; and U.S. patent application Ser. No. 09/001,598, filed Dec. 31, 1997, entitled "Directory Based Cache Coherency System Supporting Multiple Instruction Processor and Input/Output Caches, all assigned to the assignee of the present invention and all incorporated herein by reference.

TECHNICAL FIELD

This invention relates to the field of logic simulation of electronic circuits. More specifically, this invention relates to methods and apparatus for selectively displaying signal values generated by a logic simulator.

BACKGROUND OF THE INVENTION

Over the past several decades, computer performance has increased at an exponential rate. A primary reason for this dramatic increase in performance is the rapid advancement of integrated circuit technology. Each generation of integrated circuit technology can typically accommodate four times more circuitry than the previous generation. Because more circuitry can be provided on a single integrated circuit, fewer integrated circuits are required. Besides increasing the performance, circuit integration can reduce the size, power, and cost of such systems.

The design and test of these systems becomes more difficult, time consuming and tedious as system integration increases. One reason for this is that the number of input and/or output pins on an integrated circuit is typically limited, and yet the amount of circuitry on the integrated circuit is dramatically increased. Consequently, modem integrated circuits tend to have an ever increasing number of internal nets that are neither controllable nor observable from the input and/or output pins of the device. This can make testing and debugging such devices difficult.

One approach for increasing the testability of modern integrated circuits is to include built-in-self-test or the like into the design. One built-in-self-test approach involves replacing each of the registers in the design with scan type registers that can operate in both a functional mode (parallel) and in a test mode (serial scan mode). Each of the scan registers is connected to form one or more scan chains. For many built-in-self-test schemes, shadow registers are also provided at the input and output pins. This allows the input and output pins to be both controllable and observable via one or more scan chains.

To test the integrated circuit, the scan registers are put into a test mode, and a test vector is serially scanned into one or more of the scan chains. The scan registers are then put into a functional mode, and clocked once. When the scan registers are clocked, the test vector data passes from the original scan registers, through selected logic, and to receiving scan registers. The scan registers are then put back into the test mode, and the results are scanned out of the circuit and compared to an expected result. This is typically repeated with a number of different test vectors until an acceptable level of fault coverage is obtained.

A limitation of many built-in-self-test schemes is that significant overhead is required. This typically includes replacing each register within the design with a larger and more complex scan register. In addition, many built-in-self-test schemes require that the integrated circuit be in a test mode before a test vector can be scanned into the circuit. Thus, those errors that occur during functional operation are typically not detected and/or analyzed. Software errors or the like, which are traditionally detected and analyzed during functional operation of the device, are therefore not handled well by many built-in-self-test schemes. These limitations detract from the desirability of many built-in-self-test schemes.

To help analyze errors that occur during functional operation of a system, history stacks or the like have been incorporated into circuit designs. A history stack is a collection of "n" registers that store the previous "n" states of one or more nets in the design, where "n" is greater than or equal to one. When an error is detected, the historical data stored in the history stack can then be used to determine the cause of the error. History stacks may be particularly useful because the success of debugging many design problems is dependent on the knowledge of the sequence and type of events that occurred just prior to the unexpected logic behavior or error condition. The historical data stored in the history stacks can often provide this information.

A limitation of using a history stack approach is that significant overhead may be required. A history stack must typically be provided for each net in the design that may be deemed critical during later testing of the circuit. Since it is difficult to predict which nets within the design will be deemed critical for debugging an unexpected problem, circuit designer must typically provide many history stacks throughout the design. These history stacks can represent a significant overhead within the design.

Another limitation of using history stacks is that the proper "critical" nets within the design must be selected during the design phase. This is often problematic because the nets that would be helpful in debugging an unexpected logic behavior cannot be efficiently predicted during the design phase. Thus, it is often difficult to identify the "critical" nets within the design. If the proper critical nets are not identified correctly, historical data relating to a particular error may not be available, making it difficult to debug the error.

Another limitation is that history stacks are typically only useful in detecting errors in hardware that has already been built. It is costly to correct a logic design error after the hardware has been built. To correct just one integrated circuit, for example, at least one new mask must be made, and at least one lot of new wafers must be fabricated using the new mask. This can cost significant amounts of money, and often more importantly, significant amounts of time (e.g. schedule).

To reduce the chance of having a design error, extensive logic simulations are often performed. To perform the logic simulations, the circuit design is often modeled using a high-level behavior language such as the VHSIC (Very High Speed Integrated Circuits) Hardware Description Language (VHDL). Timing information may be included in the model.

Before executing a logic simulation, the circuit designer must typically specify one or more test vectors for forcing the inputs of the design. The circuit designer typically also identifies which of the nets within the design to observe during the simulation. This is typically accomplished by designating selected signals as being listed or traced. When a signal is designated as being traced, for example, the logic simulator may display the logic state of the signal versus time in a wave format. When a signal is designated as being listed, the logic simulator may display the logic state of the signal versus time in a tabular format, wherein each column in the table corresponds to a particular signal, and each row in the table represents a time.

Some logic simulators allow the user to select when to provide an updated listing of the identified signals. For example, some logic simulators have two modes for updating the identified signals. One mode is to list on "interval" and the other mode is to list on "change". In a list on interval mode, the simulator typically updates the signal values of all listed signals at a specified time interval. The specified time interval is often set to correspond to, for example, the expected clock period of the circuit design. Conversely, the list on change mode typically updates the signal values of all listed signals whenever any of the listed signals changes state. The list on change mode typically provides a longer output than the list on interval mode, at least when timing delays through non-register circuitry is simulated.

Since many circuit designs have a large number of nets, logic simulators typically only store a historical record for those signals that are identified as being listed or traced. Historical data regarding those signals that are not identified as being listed or traced are typically not stored. Since it is difficult to determine in advance which signals will be of interest when debugging an unexpected problem, circuit designers typically designate a large number of signals to be listed or traced. Accordingly, the output listing or trace window of many logic simulation runs is large, particularly when entire systems or subsystems are simulated over a number of clock periods. Sifting through these large output listings or trace windows to find selected signals and/or events can be difficult, time consuming and tedious.

Therefore, it would be desirable to provide a method and apparatus for displaying only those signal values that are relevant to particular problem and/or that fall within a relevant time period. Also, it may be desirable if the signal values are displayed in a manner chosen by the user. This may help the circuit designer efficiently obtain the relevant signal values; thereby potentially reducing the time required to debug a particular problem.

SUMMARY OF THE INVENTION

The present invention overcomes many of the disadvantages of the prior art by providing a method and apparatus for selectively displaying signal values generated by a logic simulator. Preferably, only those signal values that are relevant to a particular problem are displayed. This may reduce the need to sift through large output listings and/or trace windows to identify the relevant information.

In accordance with one embodiment of the present invention, a data processing system is provided that is suitably programmed to identify the time at which one or more of selected signal values are in a predetermined state. The selected signals are preferably those signals that are listed or traced by the logic simulator, and are a subset of all of the signals in the circuit design. The data processing system further preferably displays the signal values of a predetermined set of signals that correspond to a time that is related to the identified time. The predetermined set of signals is preferably a subset of the selected signals. The predetermined set of signals may be displayed on an electronically controlled screen, such as a cathode ray tube (CRT) or a liquid crystal display (LCD), or may be printed on a fixed medium, such as paper.

The present invention contemplates any number of methods for identifying the time at which one or more of the selected signals are in a predetermined state. One illustrative method includes identifying when one or more of the selected signals are in a particular logic state (e.g. logic 1). Another illustrative method includes performing one or more logical operations using the signal values of one or more of the selected signals. For example, an "AND" operation of two of the selected signals may be performed, and the signal values associated with the predetermined set of signals may be displayed if the AND operation yields a logic 1. Any logical operation or combination thereof involving one or more of the selected signals is contemplated. In addition, logical operations including those involving if-then statements and other conventional programming statements are also contemplated.

The logic simulator is preferably an application program having a simulation kernel, wherein the primary responsibility of the simulation kernel is to perform the logic simulation and generate the resulting signal values. It is contemplated that the logic simulator itself may identify the time at which one or more of the selected signal values are in a predetermined state. The logic simulator may also display the signal values of the predetermined set of signals that correspond to a time that is related to the identified time. Preferably, the logic simulator application program includes sub-routines and/or functions that are separate from the simulation kernel for identifying and displaying the appropriate signal values.

Attentively, or in addition to, it is contemplated that the identifying and displaying functions may be performed by a post-processing program that is separate from the logic simulator application program. In this embodiment, the logic simulator preferably includes a storing function for storing the selected signal values to one or more files. Normally, this is accomplished by storing a listing of the selected signals, as described above. A post-processing program may then extract the appropriate signal values from the listing and display the results. Preferably, the post-processing program performs at least one of the following actions selecting one or more of the selected signal values; combining one or more of the selected signal values; classifying one or more of the selected signal values; grouping one or more of the selected signal values; arranging one or more of the selected signal values; and formatting one or more of the selected signal values.

Preferably, the post-processing program emulates a history stack. Unlike hardware history stacks, however, the history stacks of the present invention are "virtual" history stacks in that they are not incorporated into the hardware design. That is, the virtual history stacks of the present invention are only implemented in the simulation domain, and not in the hardware domain.

The post-processing program. may emulate a number of virtual history stacks, wherein each virtual history stack identifies and stores signal values that are associated with a particular event or part of the system. When it is desirable to examine the signals associated with a particular event or part of the system, a corresponding virtual history stack is selected and executed. The selected virtual history stack preferably processes the output provided by the logic simulator, and displays only the desired signals associated with the event or part of the system.

Like hardware history stacks, the "virtual history stacks" of the present invention can display the previous "n" states of the corresponding signals, where "n" is user definable. However, unlike hardware history stacks, the "virtual history stacks" can grow to very large sizes, dependent only on the length of time simulated and the size that a logic simulator output file is allowed to reach. The "virtual history stacks" can also post states, if desired by the user, e.g. to observe the behavior after an identified condition was reached. As indicated above, history stacks in general may be particularly useful because the success of debugging many design problems is dependent on the knowledge of the sequence and type of events that occurred just prior to the unexpected logic behavior or error condition. The historical data stored in the virtual history stacks can often provide this information.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Generally, the present invention provides a method and apparatus for selectively displaying signal values generated by a logic simulator. Preferably, only those signal values that are relevant to a particular problem or event are displayed. The logic simulator itself may identify and display the selected signals, or a post-processor may read the list or trace window data provided by the simulator and identify and display the appropriate signals. In either case, the present invention may reduce the need to sift through large output listing and/or trace window data to identify the signal values that are relevant to a particular problem or event.

Figure 1:
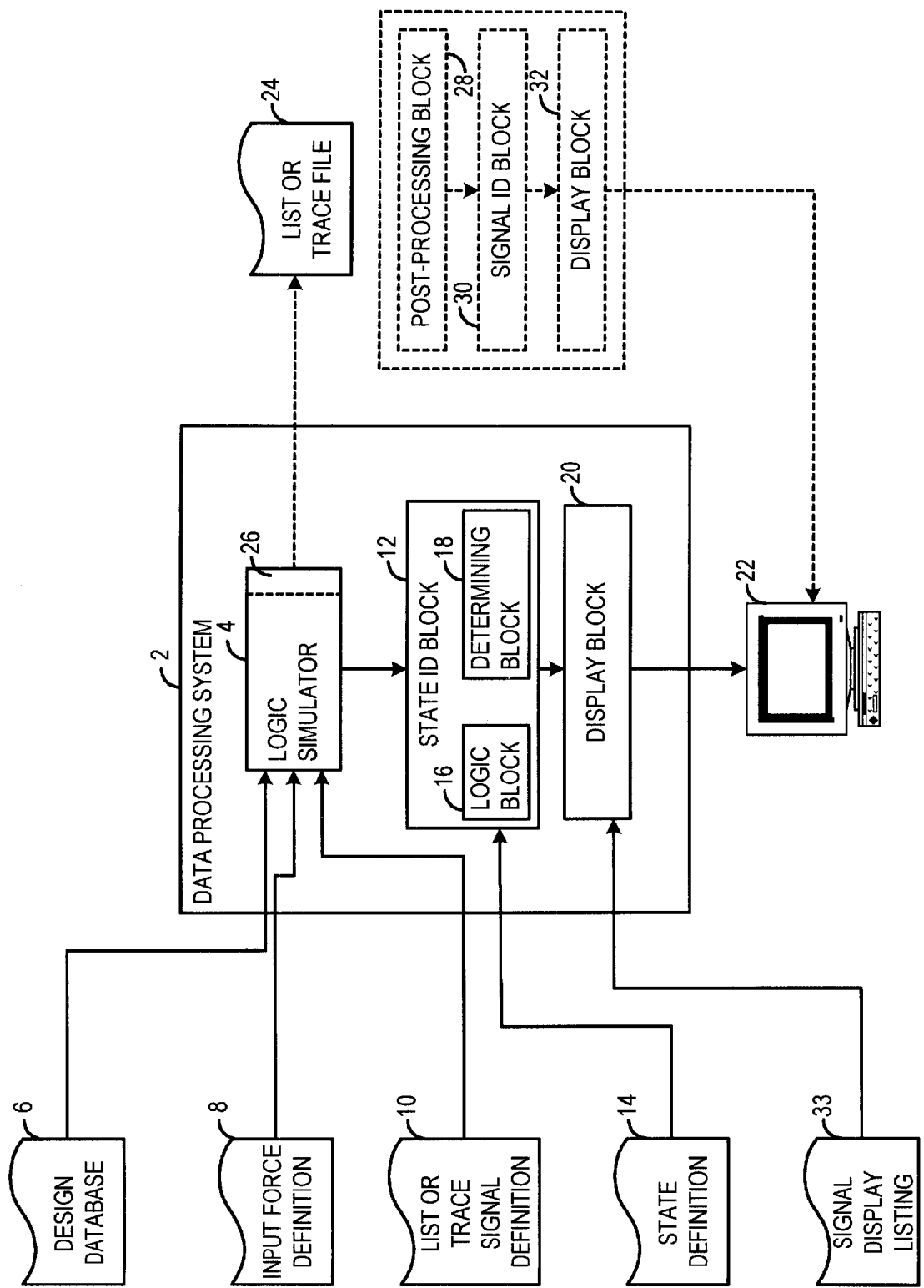
FIG. 1 is a block diagram showing an illustrative embodiment of the present invention.

Referring now to the drawings, FIG. 1 is a block diagram showing a first illustrative embodiment of the present invention. A data processing system, is generally shown at 2, and includes a logic simulator block 4, a state identification block 12 and a display block 20. The state identification block preferably includes a logic block 16 and a determining block 18.

In use, the logic simulator block 4 reads the design database 6, the input force definition 8 and the list/trace signal definition 10. The design database 6 preferably is a behavior description of a desired circuit design, preferably in a high-level behavioral description language such as VHDL. Timing information may also be included. The input force definition 8 is typically provided by the user, and defines the forces for the input signals of the circuit design. The list/trace signal definition 10 also is typically provided by the user, and specifies the signals that are to be listed and/or traced. As indicated above, the circuit designer typically also identifies which of the nets within the design to observe during the simulation. This is typically accomplished by designating selected signals as being listed or traced. When a signal is designated as being traced, for example, the logic simulator typically displays the logic state of the signal versus time in a wave format. When a signal is designated as being listed, the logic simulator typically displays the logic state of the signal versus time in a tabular format, wherein each column in the table corresponds to a particular signal, and each row in the table represents a time.

The list/trace signal definition 10 may also specify when to provide an updated listing of the identified signals. For example, some logic simulators have two modes for updating the identified signals. One mode is to list on "interval" and the other mode is to list on "change". In a list on interval mode, the simulator typically updates the signal values of all listed signals at a specified time interval. The list on change mode typically updates the signal values of all listed signals whenever any of the listed signals changes state.

The logic simulator block 4 then runs a logic simulation, using the design database 6, the input force definition 8 and the list/trace signal definition 10. The logic simulator block 4 generates a list and/or trace output, and provides the list and/or trace output to the state identification block 12. The state identification block 12 identifies a time at which one or more of the signal values are in a predetermined state. The predetermined state may be specified in the state definition 14.

The present invention contemplates any number of methods for, identifying the time at which one or more of the signal values are in a predetermined state. One illustrative method includes identifying when one or more of the signal values are in a particular logic state (e.g. logic 1). Another illustrative method includes performing one or more logical operations using the signal values of one or more of the signal values. For example, an "AND" operation of two of the signal values may be performed. Logic block 16 may perform this logical operation. Determining block 18 may determine if the logical operation yielded a desired result. If the logical operation yielded a desired result, the signal values associated with the predetermined set of signals may be displayed. For example, the signal values associated with the predetermined set of signals may be displayed if the AND operation discussed above yields logic 1. Any logical operation or combination thereof involving one or more of the selected signals is contemplated. In addition, logical operations including those involving if-then statements and other conventional programming statements are also contemplated.

The state identification block 12 indicates to the display block 20 when and if the one or more signal values are in a predetermined state. The display block 20 controls a display 22. The display 22 is preferably an electronically controlled screen, such as a cathode ray tube (CRT) or a liquid crystal display (LCD). It is also contemplated, however, that display 22 may be a printer for printing on a fixed medium such as paper.

The display block 20 caused display 22 to display only those signal values that correspond to a predetermined set of signals. The predetermined set of signals is preferably a sub-set of the signals listed in the list or trace signal definition 10. The predetermined set of signals may be specifically identified in a signal display listing 33.

The display block 20 may also cause display 22 to display only those signal values that correspond to a time period that is related to the identified time. For example, the display block 20 may cause display 22 to display the signal values of the predetermined set of signals as they existed during a time period just prior to the time that the one or more signal values were determined to be in the predetermined state. Displaying a number of previous signal values relative to the predetermined state may be useful because the success of debugging many design problems is dependent on the knowledge of the sequence and type of events that occurred just prior to the unexpected logic behavior or error condition.

Alternatively, or in addition to, it is contemplated that the state identifying and signal displaying fimctions may be performed by a post-processing block 28. In this embodiment, the logic simulator block 4 includes a storing block 26 for storing the signal values of selected signals to one or more output files 24. The selected signals are preferably those identified in the list or trace signal definition 10. The post-processing block 28 may then extract the appropriate signal values from the output file 24 and display the appropriate results.

The post-processing block 28 preferably includes a signal identification block 30 and a display block 32. The signal identification block 30 extracts the appropriate signal values from the output file 24 in a manner similar to that described above with respect to state identification block 12. The display block 32 causes the display 22 to display the appropriate signal values, in a similar manner to that described above with respect to display block 20.

Figure 2:
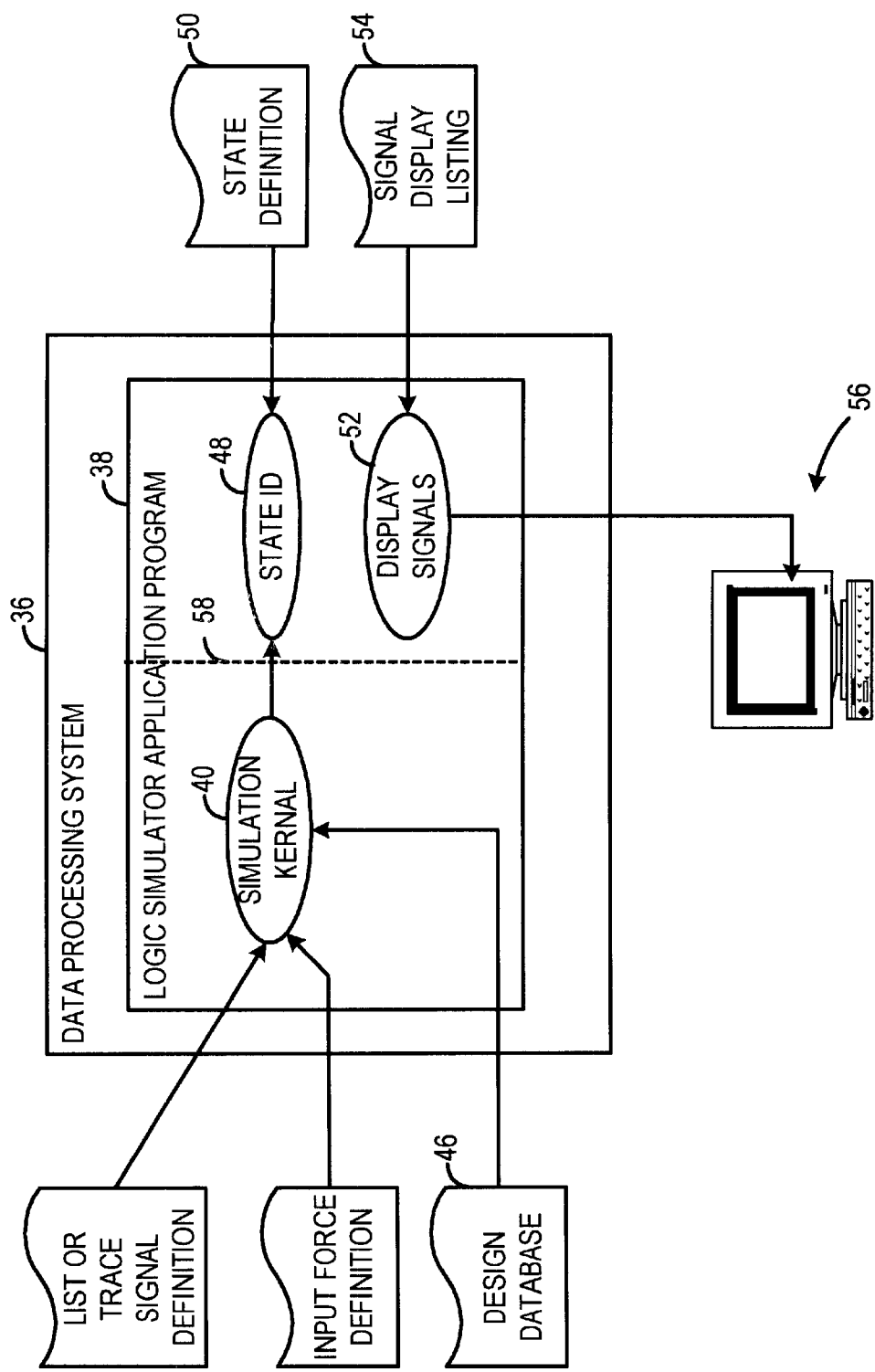
FIG. 2 is a block diagram showing another illustrative embodiment of the present invention.

FIG. 2 is a block diagram showing another illustrative embodiment of the present invention. In this embodiment, the logic simulator is an application program 38 running on a data processing system 36. The logic simulator application program 38 preferably has a simulation kernel 40. The primary responsibility of the simulation kernel 40 is to perform the desired logic simulation of a circuit design database 46, and provide the corresponding signal values.

In one embodiment, the logic simulator application program 38 itself may identify the time at which one or more of the selected signal values are in a predetermined state. This may be accomplished using a state identification module 48 within the logic simulator application program 38. The predetermined state is preferably defined in the state definition 50. The state identification module 48 preferably reads the state definition 50. The logic simulator may also display the signal values of the predetermined set of signals that correspond to a time period that is related to the identified time. This may be accomplished using a display signal module 52 within the logic simulator application program 38. The predetermined set of signals is preferably defined in the signal display listing 54. The display signal module 52 preferably reads the signal display listing 54. The state identification module 48 and the display signal module 52 are preferably separate from the simulation kernel to not slow the performance of the simulation kernel 40.

It is also contemplated that the state identification module 48 and display signal module 52 may be in one or more separate application programs that are separate from the logic simulator application program 38. For example, the state identification module 48 and display signal module 52 are shown in phantom to be in an application program that is separate from the logic simulation application program 38, as indicated by the dotted line 58.

Figures 3A, 3B, 3C:
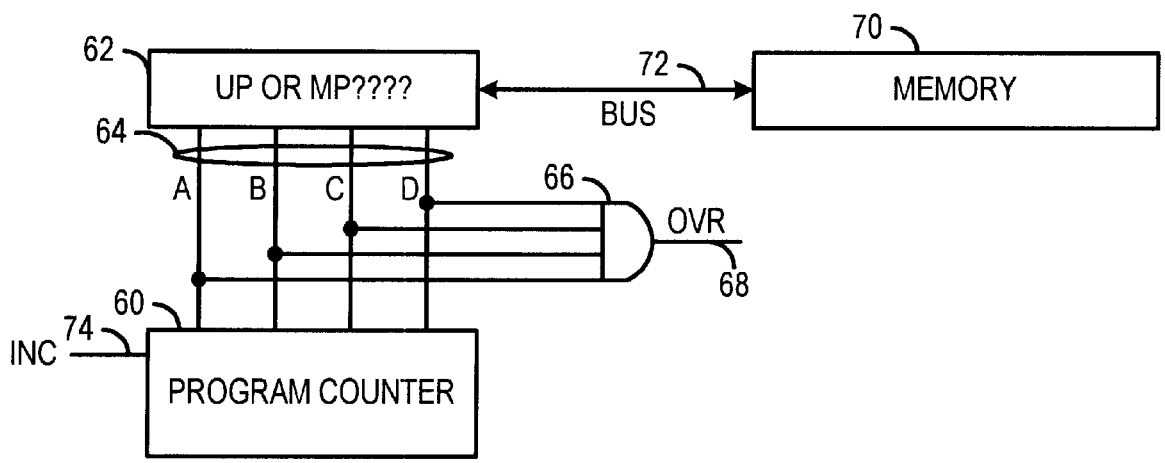
FIG. 3A is a schematic diagram showing an illustrative circuit design.
FIG. 3B is a table showing an illustrative output list resulting from a logic simulation of the circuit design database of FIG. 3A.
FIG. 3C is an illustrative virtual history stack that has been extracted from the output list of FIG. 3B.

Referring now to FIG. 3A, wherein a schematic diagram of an illustrative circuit design is shown. The illustrative circuit design includes a program counter, a microprocessor 62 and a memory 70. The program counter has an increment input and four output lines A, B, C, and D. The four output lines collectively 64, are connected to the address input of microprocessor 62. The microprocessor 62 is then connected to the memory 70 via bus 72. Finally, an AND gate 66 is connected to each of the four output lines A, B, C and D, and provides an output signal OVR 68. The output signal OVR 68 indicates when the address provided by program counter 60 via output lines A, B, C and D is equal to "1111".

The circuit design shown in FIG. 3A is preferably modeled using VDHL. The VHDL code is preferably compiled and provided to a logic simulator such as the Leap Frog VHDL Simulator, available from Cadence Design Systems, Inc. The user then identifies a number of input forces, such as forcing the increment signal 74 to a one. The user also identifies selected signals to be listed by the logic simulator. Finally, the user specifies the mode for updating the signal values in the list. In the example shown, the mode is selected to be "list on interval".

FIG. 3B is a table showing an illustrative output list resulting from a logic simulation of the circuit design of FIG. 3A. The first column shows several time intervals, indicating that the mode selected for updating the signal values is "list on interval". The second through fifth columns show the signal values of output signals A, B, C and D. The sixth column shows the signal value of the increment. input 74. As indicated above, the increment input 74 is forced to a logic I state by a user defined input force. The seventh column shows the signal value of OVR 68. The eighth column shows the signal value of bus 72. Thus, signals A, B, C, D, Inc, OVR and Bus are designated as being listed. As indicated above, logic simulators typically only store a historical record for those signals that are identified as being listed or traced. Historical data regarding those signals that are not identified as being listed or traced are typically not stored.

At time 40, the signal values of output signals A, B, C, and D become "1111". Thus, the OVR signal 68 becomes "1". In the illustrative diagram, the state identification block may identify the time that the state of the OVR signal equals "1", which corresponds to when the program counter 60 overflows. The predetermined state may be designated in a state identification file or the like. Specifically, the state identification function may identify that at time 40, the one or more signal values that are designated as being listed (e.g. OVR) are in a predetermined state (e.g. "1"), as indicated generally at 76.

FIG. 3C is an illustrative virtual history stack that has been extracted from the output list of FIG. 3B. In a preferred embodiment, the illustrative output list of FIG. 3B is processed to identify the signal values of a predetermined set of signals of the circuit design. The predetermined set of signals is preferably a sub-set of the listed signals. The illustrative output list is also preferably processed to identify those signal values of the predetermined set of signals that correspond to a time period that is related to the time that the one or more signal values that are designated as being listed (e.g. OVR) are in a predetermined state, as more described above. In the illustrative diagram, the predetermined set of signals include signals A, B, C, D, and Bus, and the corresponding time period includes times 20, 30 and 40, as shown. Thus, the signal values of signals A, B, C, D and Bus are displayed at times 20, 30 and 40.

The predetermined set of signals may be identified in a signal display listing, such as signal display listing 54 of FIG. 2. The number of signal values that are displayed before the time of the predetermined state 76 may also be designated as a time period in the signal display listing. Displaying a number of previous signal values relative to the time of the predetermined state 76 may be useful because the success of debugging many design problems is dependent on the knowledge of the sequence and type of events that occurred just prior to the unexpected logic behavior or error condition.

Figure 4:
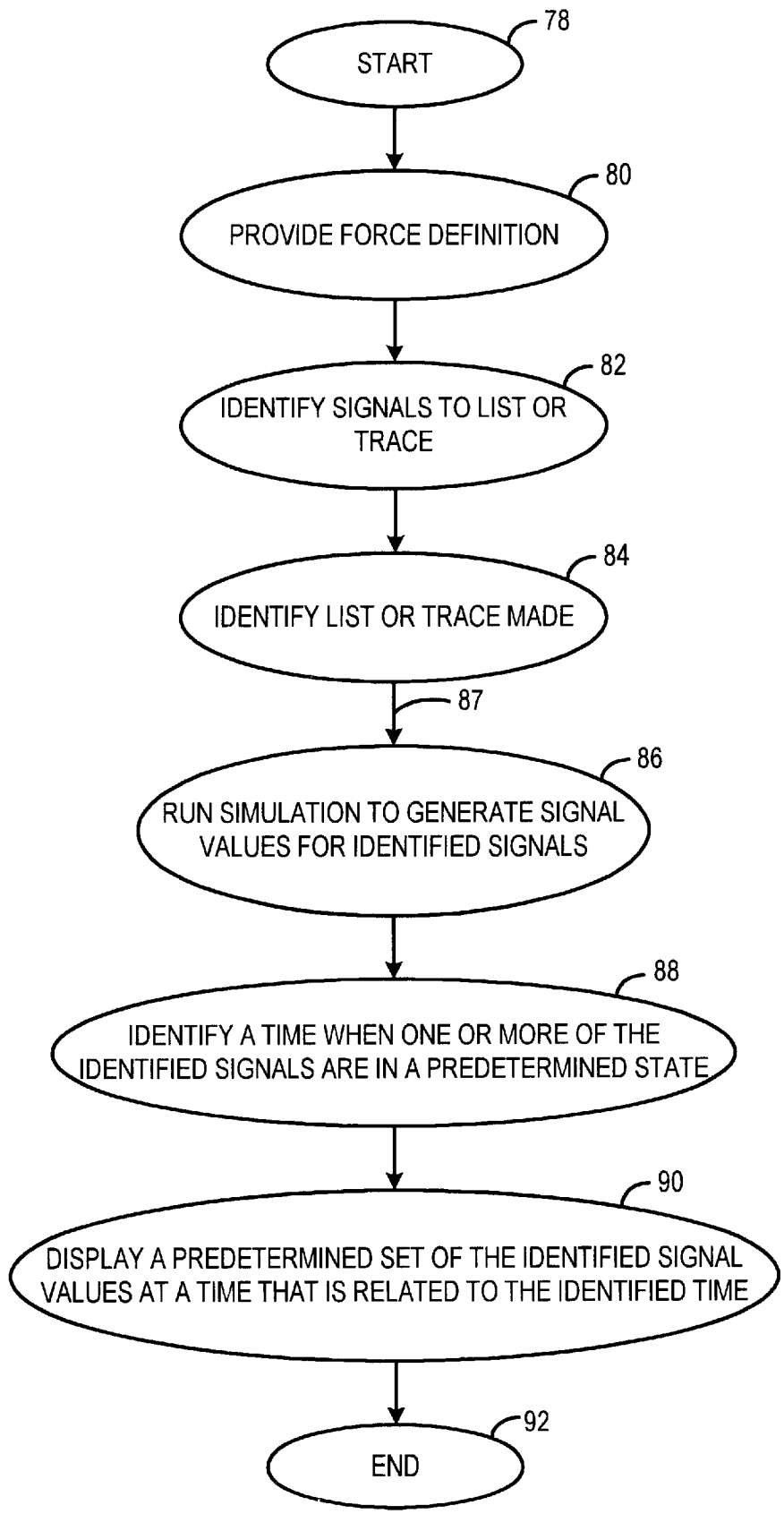
FIG. 4 is flow diagram showing an illustrative method in accordance with the resent invention.

FIG. 4 is flow diagram showing an illustrative method in accordance with the resent invention. The algorithm is entered at element 78, wherein control is passed to element 80. Element 80 provides a force definition to a logic simulator. Element 82 identifies to the logic simulator which signals to list or trace. Element 84 identifies to the logic simulator a list/trace mode. Preferably, the list/trace mode is set to "list on change".

Element 86 runs a simulation using the above force, list and mode selections. The logic simulator thus provides a number of signal values for the listed signals. Element 88 identifies a time when one or more of the listed signals are in a predetermined state. Element 90 displays a predetermined set of the listed signal values at a time that is related to the identified time. Control is passed to element 92, wherein the algorithm is exited.

Figure 5:
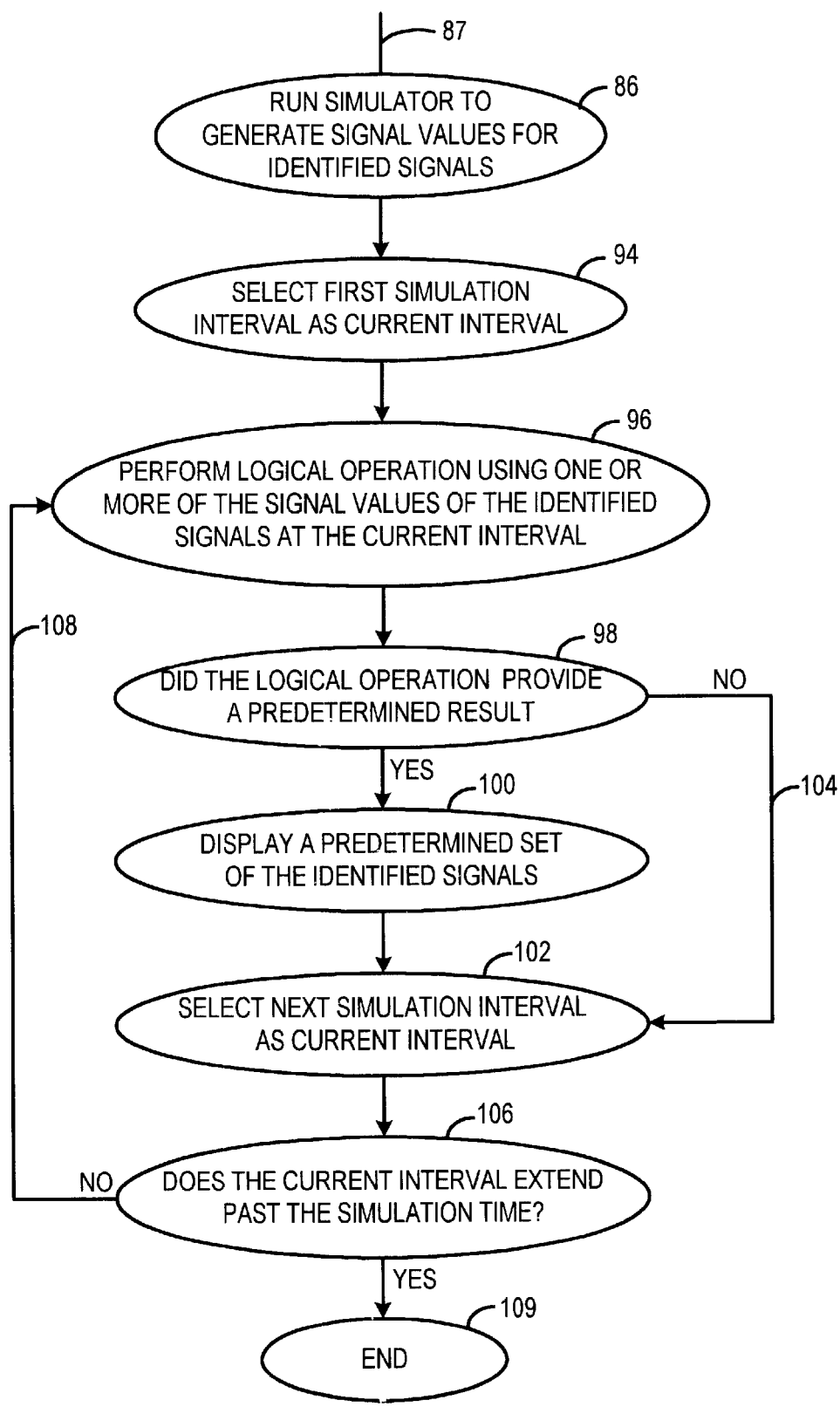
FIG. 5 is flow diagram showing another illustrative method in accordance with the present invention.

FIG. 5 is flow diagram showing another illustrative method in accordance with the present invention. The algorithm includes elements 78, 80 82 and 84 of FIG. 4. As indicated above, Element 84 identifies to the logic simulator a list/trace mode. In this embodiment, however, the list/trace mode is set to "list on interval". After a list/trace mode is selected, control is then passed to element 86 of FIG. 5, as indicated at 87. Element 86 runs a simulation using the force, list and mode selections provide by elements 80, 82 and 84 of FIG. 4. The logic simulator thus provides a number of signal values for the listed signals. Control is then passed to element 94. Element 94 selects a first simulation interval as the current interval. Control is then passed to element 96. Element 96 performs a logical operation using one or more of the signal values of the listed signals that correspond to the current interval. Control is then passed to element 98. Element 98 determines whether the logical operation produced a predetermined result. If the logical operation produced a predetermined result,. control is passed to element 100. If the logical operation did not produce a predetermined result, control is passed to element 102, as indicated at 104.

Element 100 displays a predetermined set of the listed signals. Control is then passed to element 102. Element 102 selects the next simulation interval as the current interval. Control is then passed to element 106. Element 106 determines whether the current interval extends past the simulation time. If the current interval does not extend past the simulation time, control is passed back to element 96, as indicated at 108. If, however, the current interval does extend past the simulation time, control is passed to element 109, wherein the algorithm is exited.

Figure 6:
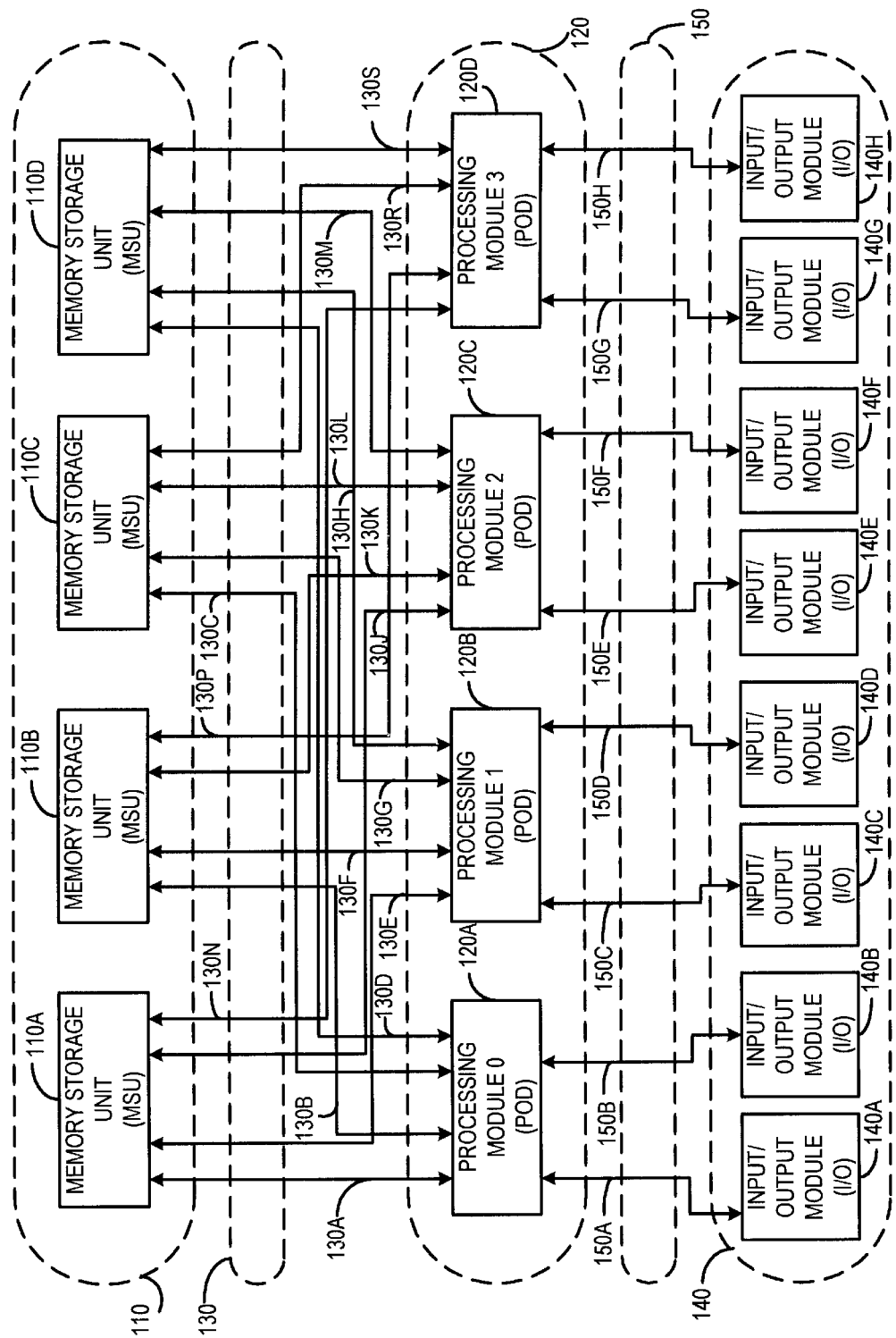
FIG. 6 is block diagram showing another illustrative circuit design.

FIG. 6 is block diagram showing another illustrative circuit design including a Symmetrical Multi-Processor (SMP) System Platform. System Platform 100 includes one or more Memory Storage Units (MSUs) in dashed block 110 individually shown as MSU 110A, MSU 110B, MSU 110C, and MSU 110D, and one or more Processing Modules (PODs) in dashed block 120 individually shown as POD 120A, POD 120B, POD 120C, and POD 120D. Each unit in MSU 10 is interfaced to all PODs 120A, 120B, 120C, and 120D via a dedicated, point-to-point connection referred to as an MSU Interface (MI) in dashed block 130, individually shown as 130A, 130B, 130C, 130D, 130E, 130F, 130G, 130H, 130J, 130K, 130L, 130M, 130N, 130P, 130R, and 130S. For example, MI 130A interfaces POD 120A to MSU 110A, MI 130B interfaces POD 120A to MSU 110B, MI 130C interfaces POD 120A to MSU 110C, MI 130D interfaces POD 120A to MSU 110D, and so on.

POD 120 has direct access to data in any MSU 110 via one of MIs 130. For example, any of PODS 120A-D can communicate with MSU 110A via interfaces MI 130A, MI 130E, MI 130J and MI 130N, respectively. Preferably, each MI interface comprises separate bidirectional data and bidirectional address command interconnections and further includes unidirectional control lines that control the operation of the data and address/command interconnections. One of the unidirectional control lines is a POD to MSU address request signal (REQ). This signal starts a POD to MSU request transaction. The bidirectional address/command interconnection provides fields that specify the desired function (FNCT) for the request. For POD to MSU requests, there is preferably a CMD field, an address field, a job number field, and several other fields.

System Platform 100 further comprises Input/Output (I/O) Modules in dashed block 140 individually shown as I/O Modules 140A through 140H, which provide the interface between various Input/Output devices and one of the PODs 120. Each I/O Module 140 is connected to one of the PODS across a dedicated point-to-point connection called the MIO Interface in dashed block 150 individually shown as 150A through 150H. For example, I/O Module 140A is connected to POD 120A via a dedicated point-to-point MIO Interface 150A. The MIO Interfaces 150 are similar to the MI Interfaces 130, but in the preferred embodiment have a transfer rate that is approximately half the transfer rate of the MI Interfaces because the I/O Modules 140 are located at a greater distance from the PODs 120 than are the MSUs 110.

A further discussion of the Symmetrical Multi-Processor (SMP) System Platform 100 of FIG. 6 can be found in co-pending U.S. patent application Ser. No. 08/965,004, filed Nov. 5, 1997, entitled "A Directory-Based Cachei Coherency System"; U.S. patent application Ser. No. 08/964,606, filed Nov. 5, 1997, entitled "Message Flow Protocol for Avoiding Deadlocks"; U.S. patent application Ser. No. 09/001,588, filed Dec. 31, 1997, entitled "High-speed Memory Storage Unit for a Multiprocessor System Having Integrated Directory and Data Storage Subsystems"; U.S. patent application Ser. No. 09/001,592, filed Dec. 31, 1997, entitled "High-Performance Modular Memory System with Crossbar Connections"; and U.S. patent application Ser. No. 09/001,598, filed Dec. 31, 1997, entitled "directory Based Cache Coherency System Supporting Multiple Instruction Processor and Input/Output Caches all assigned to the assignee of the present invention and all incorporated herein by reference.

Figure 7:
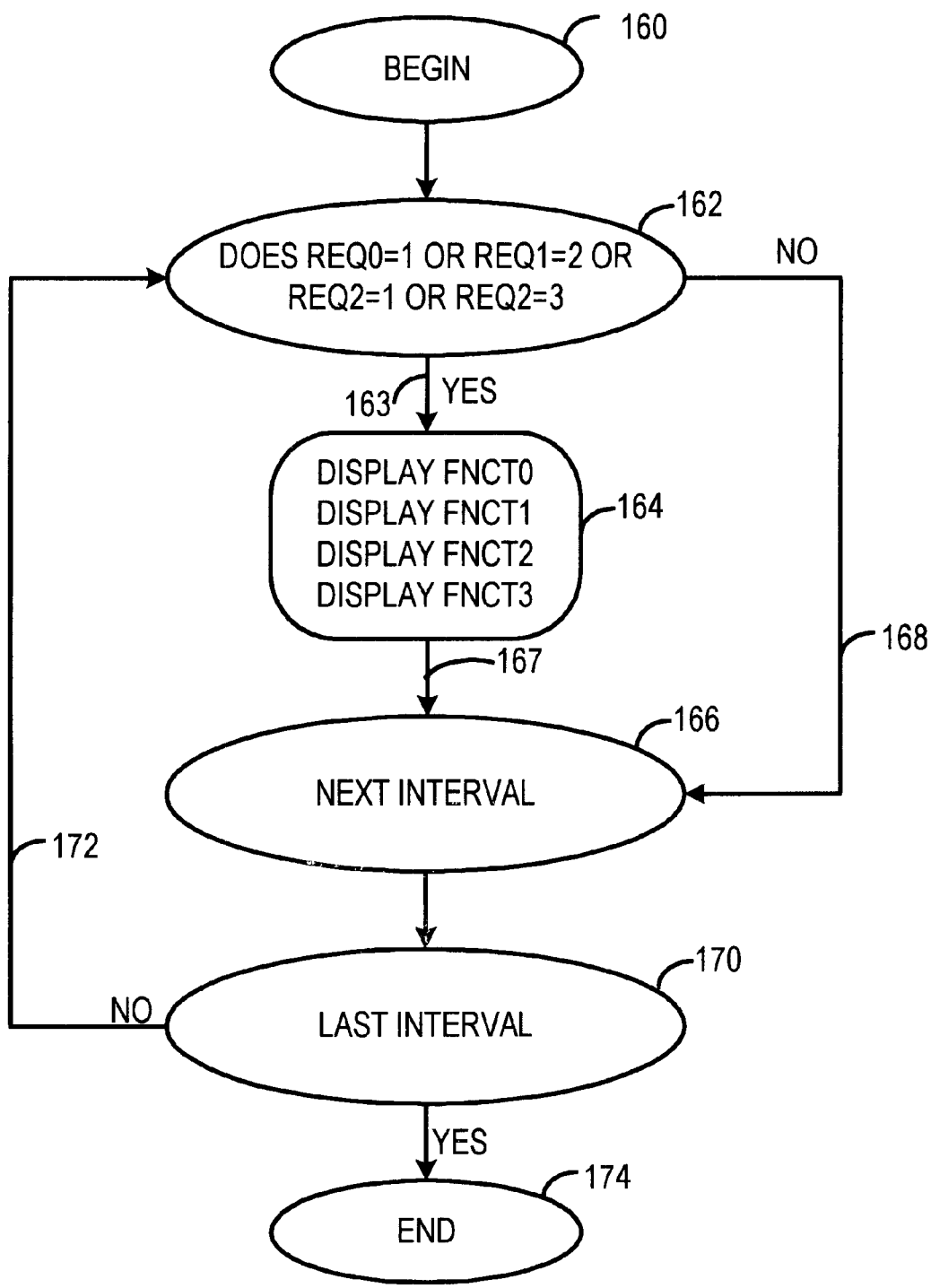
FIG. 7 is flow diagram showing an illustrative method for post processing a listing produced by a logic simulation of the circuit design of FIG. 6.

FIG. 7 is flow diagram showing an illustrative method for post-processing a listing produced by a logic simulation of the circuit design of FIG. 6. It is contemplated that the logic simulation of the circuit design of FIG. 6 may be segmented into a number of independent simulations to allow each simulation to be loaded into the memory of a simulation workstation. The segmentation of a large circuit design for logic simulation is further discussed in co-pending U.S. Pat. No. 6,336,088, issued Jan. 1, 2002, entitled "Method and Apparatus for Sychronizing Independently Executing Test Lists for Design Verification", U.S. Pat. No. 6,226,716, issued May 1, 2001, entitled "Test Drive for Use in Validating a Circuit Design", U.S. patent application Ser. No. 09/218,384, filed Dec. 22, 1998, entitled "Method and Apparatus for Efficiently Generating Test Input for a Logic Simulator", all assigned to the assignee of the present invention and all incorporated herein by reference. In the illustrative embodiment, the interface between MSU 110A and processing modules 120A–D is simulated.

The algorithm shown in FIG. 7 begins at element 160, wherein control is passed to element 162. Element 162 determines whether any POD to MSU address request signal is high. More specifically, element 162 preferably determines whether the PODO 120A to MSU 10A address request signal (REQ0) is high, whether the PODI 120B to MSU 110A address request signal (REQ1) is high, whether the POD2 120C to MSU 110A address request signal (REQ2) is high, or whether the POD3 120D to MSU 110A address request signal (REQ3) is high. If any of these request signals is high, control is passed to element 164, as shown at 163. Element 164 displays corresponding function (FNCT) requests that are on the corresponding bidirectional address/command interconnections. More specifically, element 164 preferably displays the value of the function request (FNCT0) from PODO 120A to MSU 110A, the value of the function request (FNCT1) from PODI 120B to MSU 110A, the value of the function request (FNCT2) from POD2 120C to MSU 110A, and the value of the function request (FNCT3) from POD3 120D to MSU 110A.

Control is then passed to element 166, as shown at 167. Element 166 identifies the next simulation interval. Control is then passed to element 170. Element 170 determines if the next interval is the last simulation interval. If the next interval is the last simulation interval, control is passed to element 174 wherein the algorithm is exited. If the next interval is not the last simulation interval, control is passed back to element 162, as shown at 172.

Referring back to element 162, if none of the request signals is high, control is passed to element 166, as shown at 168. Thus, none of the corresponding FNCT requests is displayed. It is contemplated that the FNCT request may be updated with the current simulation value only when the corresponding request signal (REQ) is high. This may increase the speed of the post-processing procedure.

Figure 8:
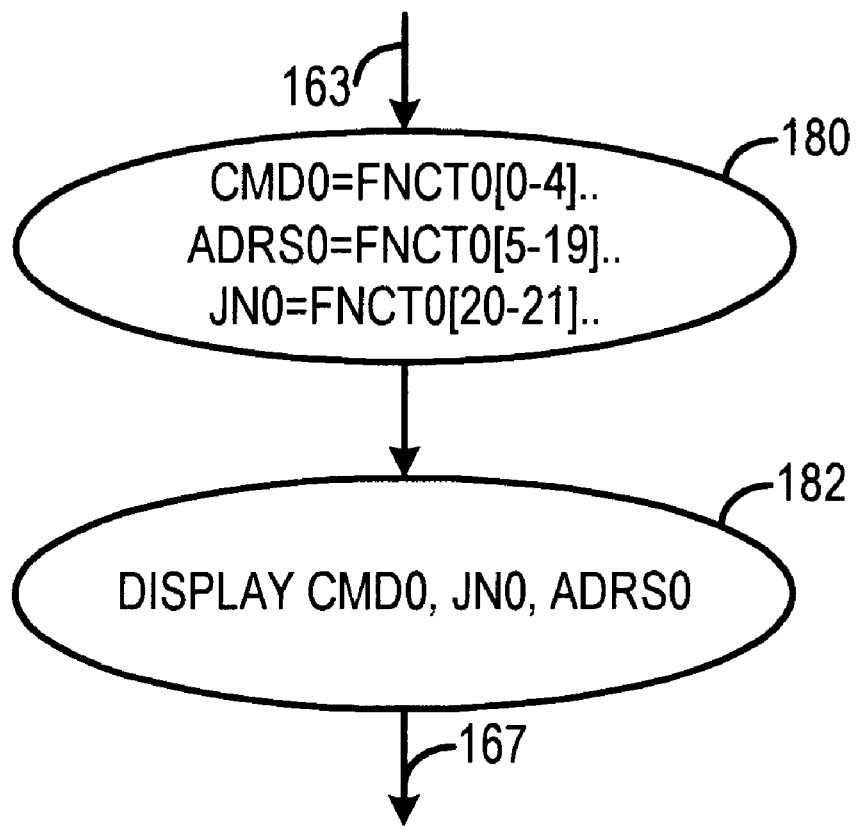
FIG. 8 is flow diagram showing a method for formatting and displaying selected signal values of the circuit design of FIG. 6.

FIG. 8 is flow diagram showing a method for formatting and displaying selected signal values of the circuit design of FIG. 6. As indicated above, the bidirectional address/command interconnection provides fields that specify the desired function (FNCT) for the corresponding request (REQ). For POD to MSU requests, there is preferably a corresponding CMD field, address field, job number field, and several other fields. Each of these fields maybe separated out from the FNCT value obtained from the simulator, and re-formatted as shown in FIG. 8. It is contemplated, however, that the fields may be combined, classified, grouped, arranged, and/or formatted as is deemed appropriate in a like manner.

Element 180 and element 182 of FIG. 8 replace element 164 of FIG. 7. Element 180 sets a temporary variable CMDO is set to equal bits 0–4 of the FNCT0 request on the corresponding bidirectional address/command interconnection. Likewise, temporary variables ADRSO and JNO are set to equal bits 5–19, and bits 20–21 of the FNCT0 request, respectively. The temporary variables are preferably defined in a post-processing application program. The particular bit numbers used are in this example are only illustrative. Further, other fields of the function request FNCT0 could be assigned temporary variables in a like manner. Control is then passed to element 182. Element 182 displays the values of temporary variables CMD0, JN0 and ADRS0, optionally formatted with a space between. Control is then passed to element 166 of FIG. 7. A similar method may be provided for formatting and displaying format requests FNCT1, FNCT2 and FNCT2.

Having thus described the preferred embodiments of the present invention, those of skill in the art will readily appreciate that yet other embodiments may be made and used within the scope of the claims hereto attached.

What is claimed is:

1. A method for selectively displaying the signal values of a predetermined set of signals of a circuit design, wherein the signal values of selected signals of the circuit design are generated at each of a number of times by a logic simulator, the method comprising the steps of:

specifying a predetermined state for one or more of the signal values;

identifying one or more of the number of times where the one or more of the signal values are in the predetermined state; and displaying the signal values of the predetermined set of signals that correspond to a time that is related to the identified time.

2. A method according to claim 1 wherein the selected signals are a subset of all signals in the circuit design.

3. A method according to claim 2 wherein the predetermined set of signals is a subset of the selected signals of the circuit design.

4. A method according to claim 1 wherein said identifying step includes the step of performing one or more logical operations using one or more of the signal values.

5. A method according to claim 1 wherein said identifying step identifies all of the times at which one or more of the signal values are in a predetermined state.

6. A method according to claim 5 wherein said displaying step displays the signal values of the predetermined set of signals at times that are related to each of the identified times.

7. A method according to claim 6 further comprising the step of storing the signal values of the predetermined set of signals that correspond to a time that is related to each of the identified times before displaying the signal values of the predetermined set of signals.

8. A method according to claim 1 wherein the logic simulator is an application program with a simulation kernel, the simulation kernel generating the signal values of the selected signals of the circuit design, but not identifying a time at which one or more of the signal values are in a predetermined state, and not displaying the signal values of the predetermined set of signals.

9. A method according to claim 1 wherein said displaying step displays the signal values of the predetermined set of signals on an electronically controlled screen.

10. A method according to claim 9 wherein the electronically controlled screen is selected from the group consisting of a cathode ray tube (CRT) and a liquid crystal display (LCD).

11. A method according to claim 1 wherein said displaying step displays the signal values of the predetermined set of signals by printing the signal values on a fixed medium.

12. A method according to claim 11 wherein the fixed medium is paper.

13. A method for selectively displaying the signal values of a predetermined set of signals of a circuit design, wherein the signal values of selected signals of the circuit design are generated at each of a number of times by a logic simulator, the method comprising the steps of:

identifying a time interval;

performing a logical operation using signal values of one or more of the selected signals, wherein the signal values correspond to a time that is related to a multiple of the time interval;

determining if the logical operation produces a predetermined result; and displaying the signal values of the predetermined set of signals if the logical operation produced the predetermined result.

14. A method according to claim 13 wherein the selected signals are a subset of all signals in the circuit design.

15. A method according to claim 14 wherein the predetermine set of signals is a subset of the selected signals of the circuit design.

16. A method according to claim 13 further comprising the step of storing the signal values of the predetermined set of signals if the logical operation produced the predetermined result.

17. A method according to claim 13 wherein the logic simulator is an application program with a simulation kernel, the simulation kernel generating the signal values of the selected signals of the circuit design, but not executing the performing, determining or displaying steps.

18. A method for selectively displaying the signal values of a predetermined set of signals of a circuit design, wherein the signal values of selected signals of the circuit design are generated at each of a number of times by a logic simulator, the method comprising the steps of:

storing the signal values of the selected signals in one or more signal files;

specifying a predetermined state for selected signals and/or combinations of selected signals; and post-processing the one or more signal files to identify the times at which the selected signals and/or combinations of selected signals are in the predetermined state.

19. A method according to claim 18 wherein the logic simulator is an application program with a simulation kernel, the simulation kernel generating the signal values of the selected signals of the circuit design, and storing the signal values of the selected signals in one or more signal files, but not executing the post-processing step.

20. A method according to claim 18 wherein said post-processing step comprises one or more of the steps selected from the group consisting of: selecting one or more of the signal values; combining one or more of the signal values; classifying one or more of the signal values; grouping one or more of the signal values; arranging one or more of the signal values; and formatting one or more of the signal values.

21. A method according to claim 18 wherein said storing step is performed using a storing function of the logic simulator.

22. A method according to claim 18 further comprising the step, of displaying the signal values of the predetermined set of signals in a predetermined format.

23. A method according to claim 18 further comprising the step of storing the signal values of the predetermined set of signals.

24. A method according to claim 23 wherein the signal values of the predetermined set of signals are stored in a virtual history stack.

25. In a data processing system having a memory, wherein the data processing system is suitably programmed to logically simulate a circuit design database stored in the memory, and thus provide a number of signal values of selected signals of the circuit design database at each of a number of times, the improvement comprising:

specifying means for specifying a predetermined state for one or more of the signal values;

identifying means for identifying one or more of the number of times where the one or more of the signal values are in the predetermined state; and displaying means for displaying the signal values of a predetermined set of the selected signals that correspond to a time that is related to the identified time.

26. A data processing system according to claim 25 wherein said identifying means includes performing means for performing one or more logical operations using one or more of the signal values.

27. A data processing system according to claim 25 wherein said identifying means identifies all of the times at which one or more of the signal values are in a predetermined state.

28. A data processing system according to claim 27 wherein said displaying means displays the signal values of the predetermined set of signals that correspond to selected times that are related to each of the identified times.

29. A data processing system according to claim 28 further comprising storing means for storing the signal values of the predetermined set of signals that correspond to a time that is related to each of the identified times before said display means displays the signal values of the predetermined set of signals.

30. A data processing system according to claim 25 wherein said displaying means displays the signal values of the predetermined set of signals on an electronically controlled screen.

31. A data processing system according to claim 30 wherein the electronically controlled screen is selected from the group consisting of a cathode ray tube (CRT) and a liquid crystal display (LCD).

32. A data processing system according to claim 25 wherein said displaying means displays the signal values of the predetermined set of signals by printing the signal values on a fixed medium.

33. A data processing system according to claim 32 wherein the fixed medium is paper.

34. In a data processing system having a memory, wherein the data processing system is suitably programmed to logically simulate a circuit design database stored in the memory, and thus provide a number of signal values of selected signals of the circuit design database at each of a number of times, the improvement comprising:

performing means for performing a logical operation using one or more of the signal values that correspond to a time that corresponds to a multiple of a predetermined time interval;

determining means for determining if the logical operation produced a predetermined result; and displaying means for displaying the signal values of a predetermined set of the selected signals if the logical operation produced the predetermined result, at a time that is related to the time at which the predetermined result was detected or produced.

35. A data processing system according to claim 34 further comprising storing means for storing the signal values of the predetermined set of signals if the logical operation produced the predetermined result.

36. In a data processing system having a memory, wherein the data processing system is suitably programmed to logically simulate a circuit design database stored in the memory, and thus provide a number of signal values of selected signals of the circuit design database at each of a number of times, the improvement comprising:

storing means for storing the signal values of the selected signals in one or more signal files;

specifying means for specifying a predetermined state for a set of selected signals and/or combinations of selected signals; and post-processing means for post-processing the one or more signal files to identify the times at which the set of selected signals and/or combinations of selected signals are in the predetermined state.

37. A data processing system according to claim 36 further comprising display means coupled to said post-processing means for displaying the selected signal values.

38. A data processing system according to claim 36 wherein said post-processing means further identifies the selected signal values by determining which of the signal values correspond to times that fall within a predetermined time period.

* * * * *